(12) United States Patent
Veggetti et al.

(10) Patent No.: US 8,330,518 B2
(45) Date of Patent: Dec. 11, 2012

(54) LOW CONSUMPTION FLIP-FLOP CIRCUIT WITH DATA RETENTION AND METHOD THEREOF

(75) Inventors: Andrea Mario Veggetti, Agrate Brianza (IT); Abhishek Jain, Delhi (IN); Pankaj Rohilla, New Delhi (IN)

(73) Assignees: STMicroelectronics S.r.l., Agrate Brianza (IT); STMicroelectronics PVT Ltd, Greater Noida (IN)

( * ) Notice: Subject to any disclaimer, the term of this patent is extended or adjusted under 35 U.S.C. 154(b) by 0 days.

(21) Appl. No.: 13/008,588

(22) Filed: Jan. 18, 2011

(65) Prior Publication Data
US 2011/0176653 A1    Jul. 21, 2011

(30) Foreign Application Priority Data
Jan. 18, 2010   (IT) .............................. BS2010A0005

(51) Int. Cl.
*H03K 3/356* (2006.01)
*H03K 3/289* (2006.01)
(52) U.S. Cl. ......................... 327/208; 327/218; 327/203
(58) Field of Classification Search .......................... None
See application file for complete search history.

(56) References Cited

U.S. PATENT DOCUMENTS

| | | | | |
|---|---|---|---|---|
| 6,762,638 | B2 * | 7/2004 | Correale et al. | 327/202 |
| 6,775,180 | B2 * | 8/2004 | Biyani et al. | 365/154 |
| 7,138,842 | B2 * | 11/2006 | Padhye et al. | 327/203 |
| 7,583,121 | B2 * | 9/2009 | Berzins et al. | 327/202 |
| 7,610,572 | B2 | 10/2009 | Kanno et al. | |
| 7,652,513 | B2 * | 1/2010 | Rao et al. | 327/203 |
| 7,791,389 | B2 * | 9/2010 | Remington | 327/208 |
| 2003/0188241 | A1 | 10/2003 | Zyuban et al. | |
| 2006/0192704 | A1 * | 8/2006 | Han et al. | 341/143 |
| 2006/0267654 | A1 | 11/2006 | Gururajarao et al. | |
| 2009/0066385 | A1 * | 3/2009 | Hoover | 327/202 |
| 2010/0141322 | A1 * | 6/2010 | Chua-Eoan | 327/202 |

* cited by examiner

*Primary Examiner* — Tuan T Lam
(74) *Attorney, Agent, or Firm* — Seed IP Law Group PLLC

(57) ABSTRACT

The present disclosure relates to a low consumption flip-flop circuit with data retention, comprising at least one flip-flop and at least one retention cell connected to the output of the flip-flop and configured so that during normal operation of the flip-flop circuit, the retention cell transmits the data or logic state present on the output terminal of the flip-flop to its own output terminal, while during low consumption operation of the flip-flop circuit a latch circuit of the retention cell suitable to memorize data or a logic state corresponding to the last data or logic state present on the output terminal of the flip-flop is activated.

31 Claims, 5 Drawing Sheets

| Parameters | Basic Flip-flop Based | Retention Flip-flop Based | Scan Retention Mechanism (proposed methodology) | |
|---|---|---|---|---|
| | | | With Normal Std. Cell Lib. | With Specific Retention cells |
| Leakage | X | Y (Y<<X, in power down mode) (13 HVT MOS Transistors per flip-flop) | 2Y (~15 HVT MOS transistors) | 0.5Y (8 HVT MOS Transistors) |
| CP-Q Delay | D | 1.2D | D | D |
| Dynamic Power | P | 1.2P | 1.02P | 1.02P |
| Area | A | 1.6A | 1.75A | ~1.6A |
| Implementation Overhead | None | Medium | High | High |
| Designing Overhead | None | High | None | High |

Fig. 5

LOW CONSUMPTION FLIP-FLOP CIRCUIT WITH DATA RETENTION AND METHOD THEREOF

BACKGROUND

1. Technical Field

The present disclosure relates to the field of integrated electronic circuits, and in particular circuits comprising at least one flip-flop. For example, the present disclosure can be used to advantage in the production of shift registers, which include a cascade connection of numerous flip-flops.

2. Description of the Related Art

As is known, even when integrated circuits are in low consumption or standby mode, there is any case a static consumption which accounts for a significant share of the total energy consumption of an electronic device. This drawback has been exacerbated by the exaggerated miniaturization of electronic components and by the high performance desired. The need therefore exists to reduce static energy consumption as much as possible when the device is in standby mode.

One of the proposed solutions is based on the use of retention flip-flops wherein the flip-flop retains the data inside it in a special latch circuit. Such circuits use two types of transistors: a first type of transistor, used for normal flip-flop operation, with a standard voltage threshold (SVT), and therefore very fast; a second type of transistor, used for operation when the circuit is in low consumption mode and with a high voltage threshold (HVT), thus with very low static consumption. The transistors of the first type and the second type are powered by independent supply voltages, so that in low consumption mode, only the transistors used for data memorization which are in case of the HVT type, remain powered.

Such solution therefore sets out to combine high dynamic performance with low static consumption.

One example of this type of flip-flop is described for instance in U.S. Pat. No. 7,138,842 B2.

However, the data retention function uses dedicated circuitry and dedicated signal control logic which controls the switchover between normal operation and the low consumption mode. With a reduced static consumption, this entails a greater dynamic consumption compared to traditional flip-flops, due to the addition of transistors, and, in some cases, reduced performance, in particular of the parameters dependent on the speed of the flip-flop.

Another solution, described for example in WO2006/127888, attempts to resolve the drawbacks of the retention flip-flops described above by taking the clock signal as the stand-by command signal and memorizing the data in a latch slave without modifying the structure of the flip-flop. In this case however there is the disadvantage of more complicated clock signal management.

BRIEF SUMMARY

One embodiment exploits the advantages of retention flip-flops, in particular a very low static consumption, without however negatively affecting other characteristics of the flip-flop circuit, such as speed and dynamic consumption.

One embodiment of the present disclosure is a flip-flop circuit which operates using a technique based on data retention and which therefore enables memorization of the data in the low consumption operation mode and recovery of the data at the end of stand-by. The flip-flop circuit can then function normally, and at the same time enable improved performance in terms of speed, energy consumption during normal operation and static consumption in stand-by compared to the retention flip-flops of the known art.

BRIEF DESCRIPTION OF THE SEVERAL VIEWS OF THE DRAWINGS

The characteristics and advantages of the electronic circuit according to the disclosure will be evident from the description below made by way of a non-limiting example of its preferred embodiments with reference to the attached figures, wherein:

FIG. 5 is a comparative table of the characteristics of flip-flop circuits.

DETAILED DESCRIPTION

Figure 1:
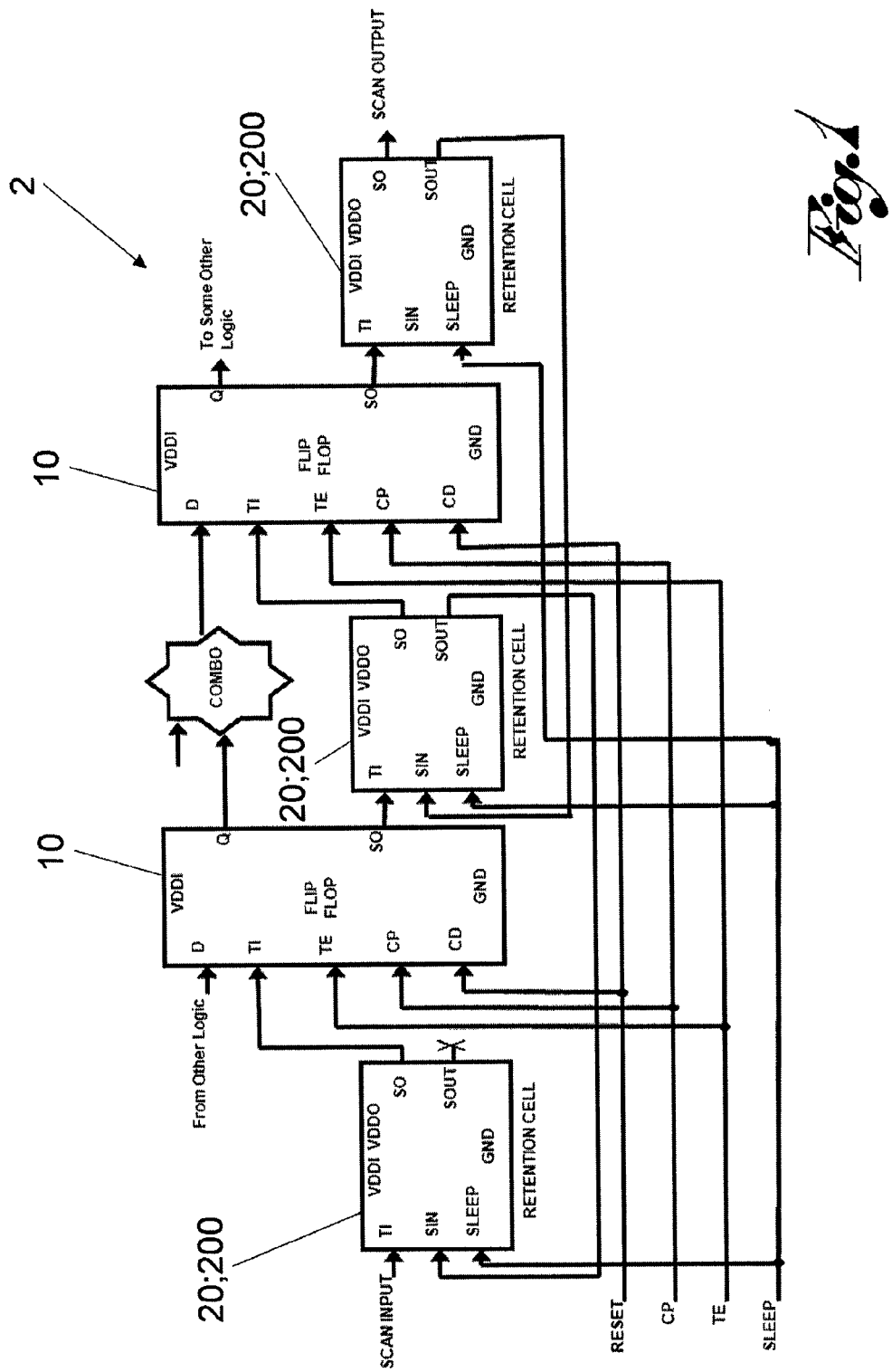
FIG. 1 shows a block circuit diagram of the flip-flop circuit according to the disclosure.

In one general embodiment, shown in FIG. 1 and globally denoted by reference numeral 2, a low consumption flip-flop circuit with data retention according to the disclosure comprises at least one flip-flop 10 having at least one input terminal D to receive a logic state, a first output terminal Q to supply an output data, a second output terminal SO which assumes the same value as the first output terminal, and a supply terminal VDDI to receive a first supply voltage VDDI. As used herein, "logic state" is intended to include any digital value, such as a datum, control value, programming value, signal value, etc.

In one embodiment, during normal operation mode, the flip-flop 10 transmits the data on the input terminal D to the output terminals Q and SO during the changing of the state (for example the leading edge) of a clock signal, for example from low to high. To such purpose, the circuit comprises a CP line for the clock signal which is brought to each flip-flop 10.

The circuit 2 comprises, in addition, a retention cell 20; 200 having a first input terminal TI connected to the second output terminal SO of the flip-flop, a second input terminal SLEEP to receive a low consumption command, or a command which controls the passage of the circuit from the normal operation to the low consumption, or stand-by mode, and vice versa, a first supply terminal VDDI to receive a first supply voltage, a second supply terminal VDDO to receive a second supply voltage controllable independently of the first, a first output terminal SO and a second output terminal SOUT.

In one embodiment, the flip-flop circuit 2 includes just one flip-flop 10 and just one retention cell 20; 200. In other embodiments, the flip-flop circuit 10 includes a cascade of flip-flops 10 and retention cells 20; 200 as shown in FIG. 1.

The retention cell 20; 200 has, in addition, a third input terminal SIN connectable to the second output terminal SOUT of a retention cell immediately downline in the circuit 2, which includes several flip-flops connected in cascade, as will be better described below, wherein a respective retention cell 20; 200 is connected to the output of each flip-flop.

In other words, a retention cell 20; 200 is connected to the output of a respective flip-flop 10 so as to be separate from said flip-flop and not to alter the inner structure of the flip-flop 10.

In this description the terms "connected", "operatively connected", "linked up", etc. are used, save as otherwise indicated, in an equivalent manner to indicate not just a direct electrical connection between at least two elements of a circuit, but also a connection between said elements with the interposition of a circuit, for example a logic circuit, which somehow alters the state of a signal or data transmitted by one of said elements to another.

The retention cell 20; 200 is configured so that during normal operation of the flip-flop circuit 2, the retention cell 20; 200 transmits to its output terminal SO the logic state of the signal or data present on the first input terminal TI, that is on the second output terminal SO of the flip-flop 10. In other words, in such operation mode the retention cell may be defined as "transparent" in relation to the behavior of the flip-flop 10, in the sense that the same data present on the first output terminal Q of the flip-flop 10 is present on the output terminal SO of the retention cell.

As a result, the presence of the retention cell does not influence the performance, in particular the speed, of the flip-flop.

In response to activation of the low consumption command signal SLEEP (for example SLEEP=1), the flip-flop circuit goes into the low consumption or stand-by mode in which the first supply voltage VDDI is removed. In addition, the SLEEP signal activates a latch circuit 22; 220 (FIGS. 2; 4) of the retention cell 20; 200 powered by the second supply voltage VDDO and suitable to memorize the logic state corresponding to the last logic state present on the first and second output terminal of the flip-flop, in other words the last logic state loaded in the retention cell.

Upon return to normal operation mode (for example SLEEP=0), the data or logic state memorized is present on the second output terminal SOUT of the retention cell 20; 200, connected to the SIN input of the retention cell immediately upline, which at that point transfers it to its output SO. The data memorized is thus ready to be used during normal operation of the circuit in that the output SO of the cell is directly connected to the input of the flip-flop (TI) to which such data "belonged" before stand-by.

In other words, at the moment of activation of the low consumption command SLEEP, the last data present on the output of a flip-flop is loaded in the retention cell connected to said output and memorized by the latch circuit 22; 220 of said retention cell until subsequent deactivation of the low consumption command. Following such deactivation, and therefore the return of the circuit to the normal operation mode, the data memorized is carried back to the input of the flip-flop on the output of which it was present at the moment of stand-by.

In one embodiment, the flip-flop circuit 2 according to the disclosure is an integrated circuit that includes a large number of flip-flops connected to each other in cascade, for example for the realization of shift registers. In another embodiment, the flip-flop circuit 2 is an integrated circuit that includes a series of flip-flops connected to each other by a "scan chain" enabling verification of the correct operation of the chain of flip-flops. The scan chain includes respective retention cells 20; 200 positioned between two consecutive flip-flops in the chain, and uses the input TI, TE and output terminals SO of the flip-flop.

More in detail and again with reference to FIG. 1, the circuit 2 comprises flip-flops 10 connected to each other in cascade so that the first input terminal D of a subsequent flip-flop, or downline flip-flop in the chain, is operatively connected to the first output terminal Q of a previous flip-flop, or upline flip-flop in the chain. In addition, each flip-flop 10 comprises a second input terminal TI to receive a scan signal, and a third input terminal TE to receive an enabling signal of transmission of the scan signal present on the second input terminal TI to the first output terminal Q. Each retention cell 20; 200 is inserted between two consecutive flip-flops so that the output terminal SO of the cell is connected to the second input terminal TI of the subsequent flip-flop.

FIG. 1 shows an example of a circuit with two flip-flops 10 connected in cascade, at the output of each of which a retention cell 20; 200 is connected. In addition, at the input of the first flip-flop of the series of two flip-flops a retention cell is connected which has its second input terminal SIN connected to the output terminal SOUT and the first input terminal TI suitable to receive a SCAN INPUT signal to verify correct operation of the flip-flop circuit. The second output terminal SOUT of this retention cell is not used.

The retention cell connected to the output of the second and last flip-flop supplies on its first output terminal SO an output signal SCAN OUTPUT which represents the data in output to the chain of flip-flops and therefore indicates correct operation, the SCAN INPUT signal being known.

The input terminals for the enabling signal TE of all the flip-flops are connected to an external line of an enabling signal TE, coming from a controller, similarly to the clock signal, the SLEEP signal and any RESET signal.

Figure 2:
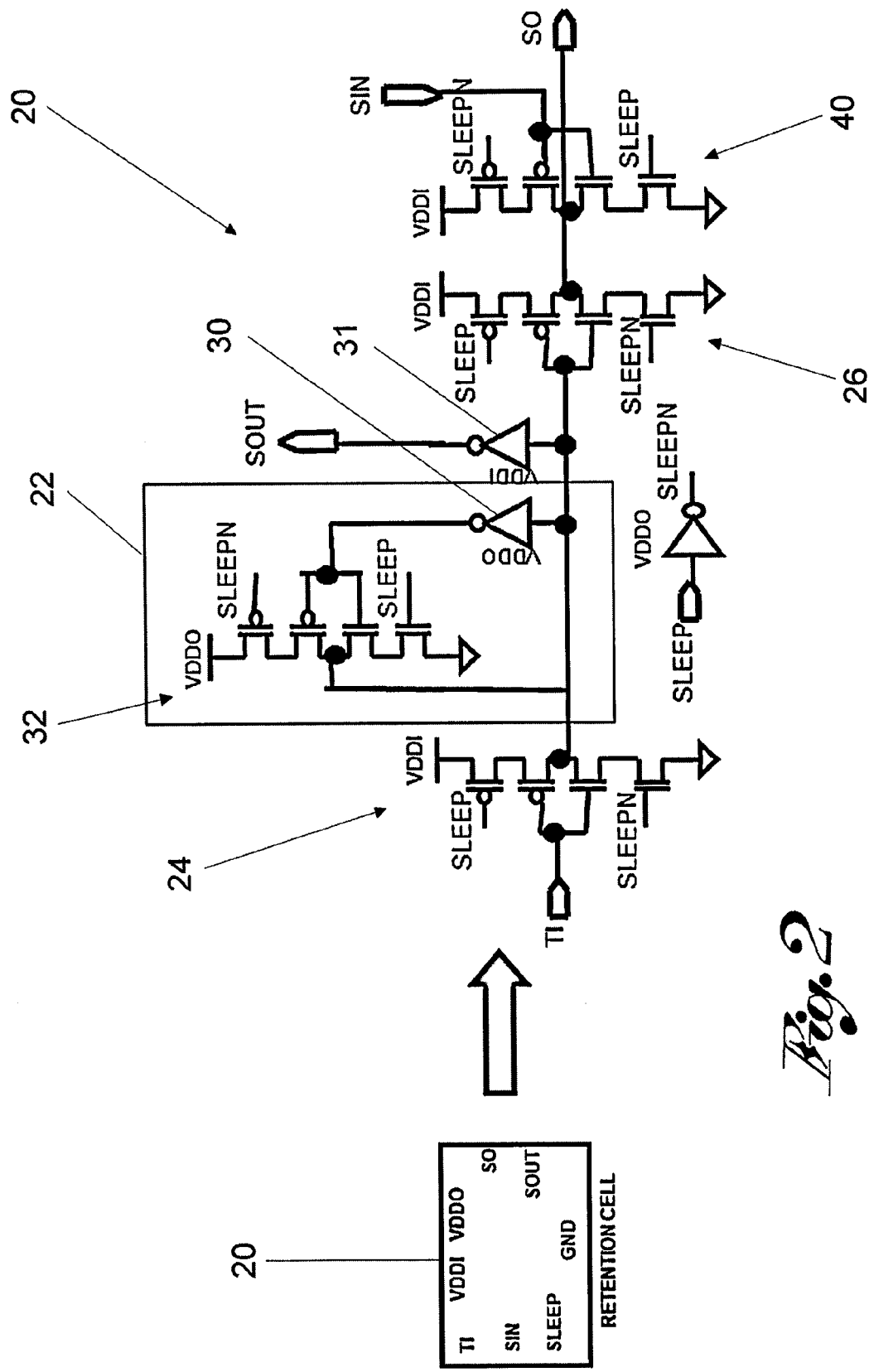
FIG. 2 shows a circuit diagram of a retention cell, in a first embodiment.

In one embodiment shown in FIG. 2, the retention cell 20 is designed to reduce the number of transistors and therefore static consumption and occupied area to a minimum. In such embodiment, the cell 20 comprises a first transmission port 24 having an input terminal connected to the first input terminal TI of the cell and an output terminal connected to the latch circuit 22 of the cell. Between the latch circuit 22 and the output SO of the cell a second transmission port 26 is interposed having an input terminal connected to the latch circuit 22 and an output terminal connected to the first output terminal SO of the cell.

The second input terminal SIN is connected to the first output terminal SO by a third transmission port 40.

Said first, second and third transmission ports 24, 26 and 40 are powered by the first supply voltage VDDI and are controlled by the low consumption command signal SLEEP so as to switchover from a state of normal operation, wherein the data present on the input terminal of the port is transmitted on the output terminal of the port, to a low consumption operation mode, wherein the port is not powered by the first supply voltage VDDI and has a high impedance which impedes said transmission of the data.

The second output terminal SOUT is connected to the latch circuit 22 through a logic port "NOT" 31 powered by the first supply voltage VDDI.

In one embodiment, in a normal operation state, the transmission ports 24, 26, 40 form the logic operator "NOT", in other words transmit in negated form to the output the data present on their input.

In one embodiment, the latch circuit 22 of the retention cell 20 comprises, connected in series to each other, a "NOT" port 30 powered by the second supply voltage VDDO and a transmission port 32 powered by the second supply voltage VDDO and controlled by the low consumption command signal SLEEP so as to witch from a conductive state, corresponding to the low consumption operation mode, wherein the data on the input terminal of the port 32 is transmitted negated on the output terminal of the port, and a state of high impedance, corresponding to the normal operation mode of the circuit.

As a result, when the circuit is in the normal operation mode, the latch circuit 22 does not work since the transmission port 32 controlled by the SLEEP signal is in a state of high impedance, while the transmission ports 24, 26 are in a conductive state and transmit the data on the cell input to the cell output, end then on the second input terminal TI of the flip-flop downline of the retention cell. Since the enabling signal TE is not activated, the data on said input TI is not however transmitted on the output Q of the flip-flop, the output of which rather receives the data present on the first input terminal D of the flip-flop.

When the circuit changes to low consumption mode, the two transmission ports 24, 26 of the cell 20 assume a state of high impedance, while the latch circuit 22 is activated and in practice implements the connection in series of two "NOT" ports. Such circuit 22 memorizes the last data loaded in the cell, that is the data present on the output terminal of the first transmission port 24 and therefore on the input terminal of the second transmission port 26.

Upon return of the circuit to normal operation mode, the first supply voltage VDDI is restored before deactivation of the low consumption SLEEP signal. Then, the data memorized is present on the output SOUT of the retention cell and is contemporarily carried on the input SIN of the retention cell upline, which upon deactivation of the low consumption signal, can transfer it directly to its output SO, and from here to the second input terminal TI of the flip-flop upline of the cell which had memorized the data. By activating the enabling signal TE and the clock signal, such data is transmitted on the output terminal Q of the flip-flop. At this point, the enabling signal can be deactivated and the chain of flip-flops resumes its normal operation "D-Q".

Getting back to the implementation aspects of the retention cell 20 illustrated in FIG. 2, each transmission port 24, 26, 32, 40 of the cell comprises a connection in series of a P-MOS transistor and of a N-MOS transistor so as to form the series of a network of "Pull-Up" and a network of "Pull-Down". The P-MOS transistor is connected to the supply voltage VDDI; VDDO by a further P-MOS transistor controlled by the low consumption command signal SLEEP; the N-MOS transistor is connected to the voltage corresponding to the zero logic by a further N-MOS transistor controlled by the low consumption negated command signal SLEEPN. Advantageously, the transistors of the transmission ports 24, 26, 40 powered by the first supply voltage VDDI have a standard voltage threshold (SVT) and are therefore very fast, while the transistors of the transmission ports 30, 32 powered by the second supply voltage VDDO have a high voltage threshold (HVT), and therefore very low static consumption.

Advantageously, during scan or debug operation enabling verification of the correct operation of the chain of flip-flops, the retention cell is completely transparent in that its input TI and its output SO are directly connected (SLEEP=0) and therefore the data present on the output SO of the flip-flop is directly connected to the input TI of the subsequent flip-flop.

Figure 3:
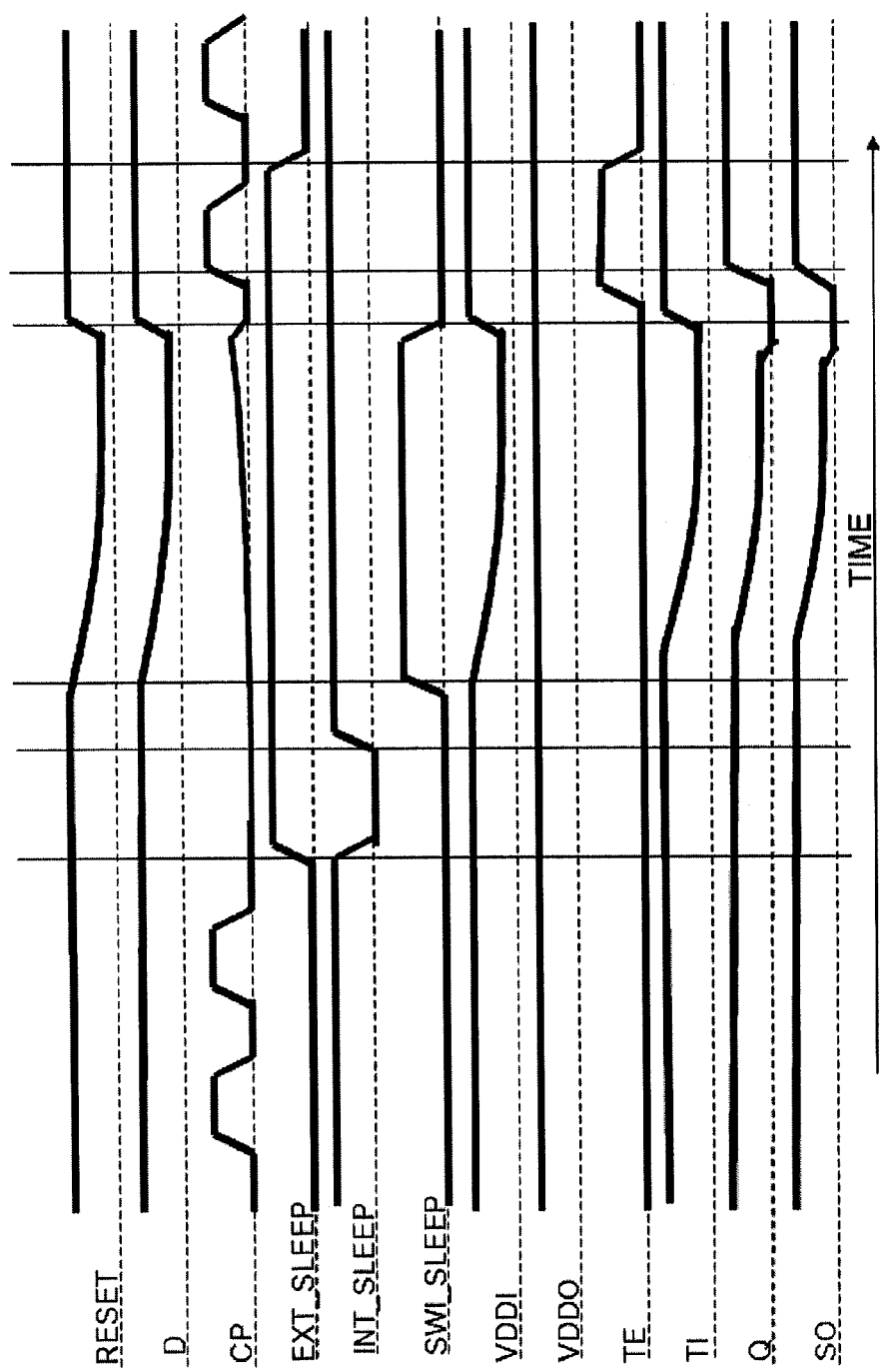
FIG. 3 shows a timing diagram of the various signals of the circuit in the previous figures.

FIG. 3 shows a temporal diagram of the wave shapes of the signals involved in the operation of the flip-flop circuit described above.

The following are shown in particular:
a signal relative to the data present on the input terminal D of a flip-flop, for example having the logic state "1" up to interruption of the power supply VDDI;
the clock signal;
the low consumption signal (EXT_SLEEP);
the two signals of the power supply voltages VDDI and VDDO, the latter always active;
the enabling signal TE;
the signal on the input terminal TI of the cell;
the signal on the output terminal Q of the flip-flop; and
the signal on the output terminal SO of the retention cell.

One may observe how, to avoid metastability phenomena of the transistors, when entering the low consumption mode, first the SLEEP signal is activated, then the first supply voltage VDDI is interrupted.

When returning to normal operation, first the supply voltage VDDI is restored, then the enabling signal TE, then the clock signal. Lastly the SLEEP signal and the enabling signal TE are deactivated.

Figure 4:
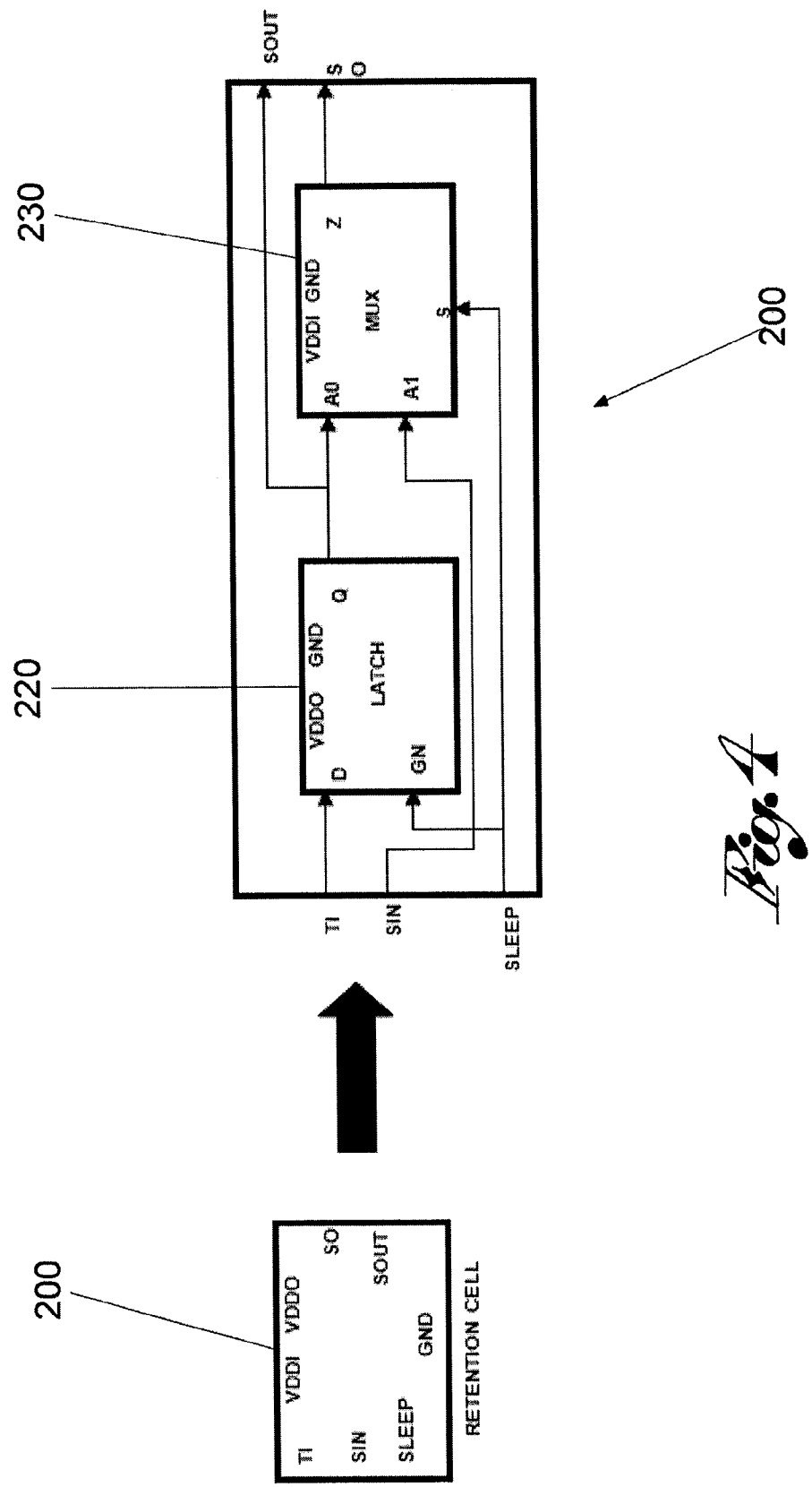
FIG. 4 is a block diagram of the retention cell in one embodiment variation.

In one embodiment variation shown in FIG. 4, the retention cell 200 is advantageously made using standard devices already available to the integrated circuitry designer. On the other hand such standardization entails the use of a greater number of transistors and therefore a slightly higher consumption and a slightly larger occupied area, as will be pointed out in more detail below.

Each retention cell 200 comprises a latch 220 powered by the second supply voltage VDDO and a multiplexer 230 with two inputs A0, A1 and a selection line S. The multiplexer 230 is powered by the first supply voltage VDDI.

As in the previous case, the retention cell 200 has, as well as the power supply terminals VDDI, VDDO and connection to the relevant voltage for the zero logic GND, a first input terminal TI, connected to the second output terminal SO of the flip-flip 10, a second input terminal SLEEP to receive the low consumption command signal, a third input terminal SIN, a first output terminal SO, connected to the second input terminal TI of the flip-flop 10 downline of the cell, and a second output terminal SOUT.

More specifically, the latch 220 has a first input terminal D, corresponding or connected to the first input terminal TI of the cell, therefore connected to the second output terminal SO of the first flip-flop 10, a second input terminal GN to receive the low consumption command signal SLEEP as the enabling signal of the latch, and an output terminal Q. Said output terminal Q of the latch 220 constitutes the first input A0 of the multiplexer 230 and is also carried on the second output SOUT of the cell 200.

The multiplexer 230 therefore has a first input terminal A0 connected to the output terminal Q of the latch 220 and a second input terminal A1 connected to the second input terminal SIN of the cell, which in turn is connected to the second output terminal SOUT of the subsequent cell.

The multiplexer 230 has, in addition, a selection terminal S to receive the low consumption command signal SLEEP as a selection signal, and an output terminal Z which corresponds to or is connected to the first output terminal SO of the cell.

In the normal operation mode of the circuit, the latch 220 transmits the logic state of the data present on the output terminal SO of the first flip-flop to its output terminal Q and the multiplexer transmits the logic state of the data present on its own first input terminal A0 to its output signal Z.

In the low consumption mode, the latch 220 memorizes the logic state of the last data present on the output terminal of the first flip-flop, while the multiplexer 230 is turned off inasmuch as connected to the VDDI power supply, preventing unwanted consumption.

The output signal of the latch, present therefore on the second output terminal SOUT of the cell, is connected in this case too to the SIN input of the retention cell upline. In this case too, before disabling the SLEEP signal the power supply to the VDDI is restored and the multiplexer of said upline cell, being activated, carries the data present on the input SIN towards its output SO, connected to the input TI of the flip-flop. The SLEEP (=0) signal is then disabled and the input TE of the flip-flop being enabled, the data present on the second input terminal TI is loaded and the flip-flop thus returned to the configuration it had before entering the low consumption mode.

In any case the temporal sequence of the signals in the phase passing from normal operation mode to low consumption mode and vice versa is the same as that described above for the retention cell in the first embodiment.

In both embodiments, the scan path between the flip-flops, already provided in a widely used type of flip-flop connected in cascade, is used to keep the data in the low consumption mode, without altering the functional path of the circuit. In other words, the circuital retention structure of the data is transferred from the functional part of the circuit to the scan part of the circuit.

In addition, the insertion of the retention cell in the scan path makes it possible to prevent violation of the hold time of the flip-flop which occurs rather in the circuital architectures in which the scan output (SO) of a flip-flop is sent directly to the scan input (TI) of the flip-flop. In fact, despite being transparent, the retention cell adds a slight delay to the propagation of the SO signal of the flip flop upline towards the TI input of the downline flip-flop, normally directly connected and without logic circuits. In this case rather, thanks to the slight delay introduced by the retention cell in propagating the signal on the output terminal SO of a flip-flop towards the input terminal TI of the subsequent flip-flop, one is sure that the data on said TI terminal is always stable in the immediate vicinity of the switch of the clock signal.

The advantages of the flip-flop circuit according to the disclosure are summarized in the comparative table in FIG. 5. The table uses as its parameters of comparison: static consumption, the speed (in terms of delay between the clock signal CP and the output Q of the flip-flop), dynamic consumption, the occupied area, the cost of the technique used to obtain a reduction of static consumption in stand-by in the application, and the relative design cost of the circuit.

A flip-flop circuit without data retention (first column), a flip-flop circuit with retention according to the known art (second column) and the flip-flop circuit according to the present disclosure, in the two embodiments with cell composed of standard components (third column) and with a specially designed cell (fourth column) were compared.

As regards static consumption (first line), indicating the consumption of a flip-flop circuit without data retention as X, the consumption of a circuit with retention according to the known art, for example comprising 13 high voltage threshold MOS transistors by Y, is much lower (Y<<X). The consumption of the circuit according to the disclosure, in the second embodiment with standard components (third column), comprising about 15 high voltage threshold MOS transistors, is about 2Y, therefore double that of traditional retention flip-flops, but in any case still much less than the flip-flops without retention. The consumption of the circuit according to the disclosure, in the first embodiment with a specially designed cell, is actually about half that of traditional retention flip-flops, thanks to the reduced number (for example 8) of MOS HVT transistors.

As regards speed, if D is the delay from CP to Q in a flip-flop circuit without data retention, the delay in a circuit with retention according to the known art is about 20% higher, on account of the additional circuitry which slows down normal operation of the flip-flop. The delay in the circuit according to the disclosure, in both embodiments, is the same as the circuit without retention in that the retention cell does not interfere with normal operation of the flip-flop.

As regards dynamic consumption, the consumption of a flip-flop circuit without data retention being indicated as P, the consumption in a circuit with retention according to the known art is about 20% higher as a result of the addition of transistors to the circuital structure of the flip-flop. The dynamic consumption in the circuit according to the disclosure, in both embodiments, is however practically the same as the circuit without retention, in that the retention cell does not interfere with normal operation of the flip-flop.

As regards the occupied area, one may note how in the embodiment of the circuit according to the disclosure with a specially designed cell, the increase due to the presence of the retention circuit is essentially the same as that of a traditional flip-flop circuit with retention.

As regards design costs, it should be emphasized that the use of standard components for the realization of the retention cell according to the disclosure renders such costs practically null.

A person skilled in the art may make modifications, adaptations and replacements of elements with others functionally equivalent to the embodiments of the flip-flop circuit according to the disclosure so as to satisfy contingent and specific requirements while remaining within the sphere of protection of the following claims. Each of the characteristics described as belonging to a possible embodiment may be realized independently of the other embodiments described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A low consumption flip-flop circuit with data retention, comprising:
   a first flip-flop having a first input terminal configured to receive a logic state, a first output terminal, a second output terminal, and a supply terminal configured to receive a first supply voltage;
   a first retention cell having a first input terminal coupled to the second output terminal of the first flip-flop, a second input terminal configured to receive a low consumption command, a first supply terminal configured to receive the first supply voltage, a second supply terminal configured to receive a second supply voltage that is independent of the first supply voltage, a first output terminal, and a second output terminal, wherein the first retention cell is configured to provide to the first output terminal of the first retention cell a logic state from the first input terminal of the first retention cell during a normal operation mode, the first retention cell including:
      a latch circuit configured to be powered by the second supply voltage and suitable to, during a low consumption mode in which the first flip-flop is not powered by the first supply voltage, memorize a logic state corresponding to a last logic state present on the second output terminal of the flip-flop;
   a second flip-flop having a first input terminal and a first output terminal; and
   a second retention cell having a first input terminal coupled to the first output terminal of the second flip-flop, a second input terminal configured to receive the low consumption command, a third input terminal, and an output terminal, the third input terminal being coupled to the second output terminal of the first retention cell and configured to receive the logic state memorized by the latch circuit of the first retention cell, and the second retention cell is configured to, on return to the normal operation mode, provide on the output terminal of the second retention cell the logic state memorized by the latch circuit and received by the third input terminal of the second retention cell.

2. A circuit according to claim 1, wherein:
the first input terminal of the first flip-flop is coupled to a second output terminal of the second flip-flop;
each flip-flop comprises a second input terminal;
the second input terminal of the first flip-flop is coupled to the output terminal of the second retention cell;
each flip-flop includes a third input terminal configured to receive an enabling signal;
the first flip-flop is configured to transmit a signal from the second input terminal of the first flip-flop to the first output terminal of the first flip-flop in response to the enabling signal; and
the second retention cell is configured to transmit the memorized logic state to the second input terminal of the first flip-flop.

3. A circuit according to claim 1, wherein the second retention cell comprises:
a latch circuit;
a first transmission port having an input terminal coupled to the first input terminal of the second retention cell and an output terminal coupled to the latch circuit of the second retention cell;
a second transmission port having an input terminal coupled to the latch circuit of the second retention cell and an output terminal coupled to the first output terminal of the second retention cell; and
a third transmission port having an input terminal coupled to the third input terminal of the second retention cell and an output terminal coupled to the first output terminal of the second retention cell,
said first, second and third transmission ports being configured to be powered by the first supply voltage during a normal operation mode and not powered by the first supply voltage during a low consumption mode, and configured to switch from the normal operation mode to the low consumption mode in response to the low consumption command, wherein each port is configured to transmit a logic state present on the input terminal of the port to the output terminal of the port during the normal operation mode, and is configured to have high impedance and prevent transmission of the logic state from the input terminal of the port to the output terminal of the port during the low consumption mode.

4. A circuit according to claim 3, wherein said transmission ports are configured to perform a NOT operation, in the normal operation mode.

5. A circuit according to claim 1, wherein:
the latch circuit of the first retention cell comprises:
a first inverter configured to be powered by the second supply voltage and having an input terminal and an output terminal; and
a first transmission port having an input terminal coupled to the output terminal of the first inverter, a control input terminal coupled to the second input terminal of the first retention circuit, and an output terminal coupled to the input terminal of the first inverter, the transmission port being configured to be powered by the second supply voltage and controlled by the low consumption command signal so as to switch from a state of conducting, wherein a logic state present on the input terminal of the port is transmitted negated to the output terminal of the port, and a state of high impedance which prevents said transmission of the logic state present on the input terminal of the port; and
the first retention cell includes a second inverter having an input terminal coupled to the output of the first transmission port and an output terminal coupled to a second output terminal of the retention cell.

6. A circuit according to claim 5, wherein the first transmission port of the latch circuit of the first retention cell comprises:
first and second P-MOS transistors coupled between the output terminal of the first transmission port and the second supply terminal, the first P-MOS transistor being configured to be controlled by a negated low consumption command signal; and
first and second N-MOS transistors coupled between the output terminal of the first transmission port and a zero logic terminal, the second N-MOS transistor being configured to be controlled by the low consumption command signal.

7. A circuit according to claim 6, wherein the first retention cell includes a second transmission port coupled between the first supply terminal and the zero logic terminal, the second transmission port including:
an input terminal coupled to the first input of the first retention cell;
an output terminal coupled to the input terminals of the first and second inverters;
third and fourth P-MOS transistors coupled between the output terminal of the second transmission port and the first supply terminal, the third P-MOS transistor being configured to be controlled by the low consumption command signal
third and fourth N-MOS transistors coupled between the output terminal of the second transmission port and the zero logic terminal, the fourth-N-MOS transistor being configured to be controlled by the negated low consumption command signal, the transistors of the second transmission port having a standard voltage threshold and the transistors of the first transmission port having a high voltage threshold.

8. A circuit according to claim 1, wherein:
the latch circuit includes a supply terminal coupled to the second supply terminal, a first input terminal coupled to the second output terminal of the first flip-flop, a second input terminal coupled to receive the low consumption command signal as an enabling signal, and an output terminal; said latch being configured to, in the normal operation mode, transmit a logic state present on the output terminal of the first flip-flop to the output terminal of the latch, and, in the low consumption mode memorize the logic state present on the output terminal of the first flip-flop; and
the first retention cell comprises:
a multiplexer having a supply terminal coupled to the first supply terminal, a first input terminal coupled to the output terminal of the latch, a second input terminal coupled to a third input terminal of the first retention cell, a selection terminal configured to receive the low consumption command signal as a selection signal, and an output terminal coupled to the first output terminal of the first retention cell, said multiplexer being configured to, in the normal operation mode, transmit data or a logic state on the first input terminal of the multiplexer to the output terminal of the multiplexer, and, on the return of the circuit to the normal operation mode, transmit a logic state present on the second input terminal of the multiplexer to the output terminal of the multiplexer.

9. A circuit according to claim 1, wherein the first flip-flop and first retention cell are integrated in a single semiconductor chip.

10. A shift register comprising:
first and second flip-flop circuits cascade-coupled to each other, each flip-flop circuit including:
a flip-flop having a first input terminal to receive data, a first output terminal, a second output terminal, and a supply terminal configured to receive a first supply voltage; and
a retention cell having a first input terminal coupled to the second output terminal of the flip-flop, a second input terminal configured to receive a low consumption command, a first supply terminal configured to receive the first supply voltage, a second supply terminal configured to receive a second supply voltage that is independent of the first supply voltage, a first output terminal, and a second output terminal, wherein the retention cell is configured to provide to the first output terminal of the retention cell a logic state from the first input terminal of the retention cell during a normal operation mode, the retention cell including:
a latch circuit configured to be powered by the second supply voltage and suitable to, during a low consumption mode in which the flip-flop is not powered by the first supply voltage, memorize a logic state corresponding to a last logic state present on the second output terminal of the flip-flop,
wherein the retention cell of the first flip-flop circuit has a third input terminal coupled to the second output terminal of the retention cell of the second flip-flop circuit.

11. A shift register according to claim 10, wherein:
the first input terminal of the flip-flop of the second flip-flop circuit is coupled to the first output terminal of the flip-flop of the first flip-flop circuit;
each flip-flop comprises a second input terminal;
the second input terminal of the flip-flop of the first flip-flop circuit is configured to receive a scan signal;
the second input terminal of the flip-flop of the second flip-flop circuit is coupled to the second output terminal of the retention cell of the first flip-flop circuit;
each flip-flop includes a third input terminal configured to receive an enabling signal;
the flip-flop of the first flip-flop circuit is configured to transmit the scan signal from the second input terminal of the flip-flop of the first flip-flop circuit to the first output terminal of the flip-flop of the first flip-flop circuit in response to the enabling signal; and
the retention cell of the first flip-flop circuit is configured to transmit the memorized logic state to the second input terminal of the flip-flop of the second flip-flop circuit.

12. A shift register according to claim 10, wherein each retention cell comprises:
a first transmission port having an input terminal coupled to the first input terminal of the retention cell and an output terminal coupled to the latch circuit of the retention cell;
a second transmission port having an input terminal coupled to the latch circuit of the retention cell and an output terminal coupled to the first output terminal of the retention cell; and
a third transmission port having an input terminal coupled to the third input terminal and an output terminal coupled to the first output terminal of the retention cell,
said first, second and third transmission ports being configured to be powered by the first supply voltage during a normal operation mode and not powered by the first supply voltage during the low consumption mode, and configured to switch from the normal operation mode to the low consumption mode in response to the low consumption command, wherein each port is configured to transmit a logic state from the input terminal of the port to the output terminal of the port during the normal operation mode, and is configured to have a high impedance and prevent transmission of the logic state from the input terminal of the port to the output terminal of the port.

13. A shift register according to claim 10, wherein:
the latch circuit of each retention cell comprises:
a first inverter configured to be powered by the second supply voltage and having an input terminal and an output terminal; and
a first transmission port having an input terminal coupled to the output terminal of the first inverter, a control input terminal coupled to the second input terminal of the retention circuit, and an output terminal coupled to the input terminal of the first inverter, the first transmission port being configured to be powered by the second supply voltage and controlled by the low consumption command signal so as to switch from a state of conducting, wherein a logic state present on the input terminal of the port is transmitted negated to the output terminal of the port, and a state of high impedance which prevents said transmission of the logic state present on the input terminal of the port; and
each retention cell includes a second inverter having an input terminal coupled to the output of the first transmission port and an output terminal coupled to the second output terminal of the retention cell.

14. A shift register according to claim 13, wherein the first transmission port of each retention cell comprises:
first and second P-MOS transistors coupled between the output terminal of the first transmission port and the second supply terminal, the first P-MOS transistor being configured to be controlled by a negated low consumption command signal; and
first and second N-MOS transistors coupled between the output terminal of the first transmission port and a zero logic terminal, the second N-MOS transistor being configured to be controlled by the low consumption command signal.

15. A shift register according to claim 14, wherein each retention cell includes a second transmission port coupled between the first supply terminal and the zero logic terminal, the second transmission port including:
an input terminal coupled to the first input of the retention cell;
an output terminal coupled to the input terminals of the first and second inverters;
third and fourth P-MOS transistors coupled between the output terminal of the second transmission port and the first supply terminal, the third P-MOS transistor being configured to be controlled by the low consumption command signal
third and fourth N-MOS transistors coupled between the output terminal of the second transmission port and the zero logic terminal, the fourth-N-MOS transistor being configured to be controlled by the negated low consumption command signal, the transistors of the second transmission port having a standard voltage threshold and the transistors of the first transmission port having a high voltage threshold.

16. A shift register according to claim 10, wherein each retention cell comprises:
   a latch having a supply terminal coupled to the second supply terminal, a first input terminal coupled to the second output terminal of the flip-flop of the first flip-flop circuit, a second input terminal coupled to receive the low consumption command signal as an enabling signal, and an output terminal; and
   a multiplexer having a supply terminal coupled to the first supply terminal, a first input terminal coupled to the output terminal of the latch, a second input terminal coupled to a third input terminal of the retention cell of the first flip-flop circuit, a selection terminal configured to receive the low consumption command signal as a selection signal, and an output terminal coupled to the first output terminal of the retention cell of the first flip-flop circuit.

17. A method, comprising:
   providing to a first retention cell a logic state on an output of a first flip-flop during a normal operation mode of the first flip-flop without influencing operation of the first flip-flop;
   powering a latch circuit of the first retention cell using a different supply voltage independent of a supply voltage of the first flip-flop; and
   memorizing in the latch circuit, during a low consumption operation mode, a last logic state present on the output of the first flip-flop, wherein on return of the latch circuit to the normal operation mode, the logic state memorized in the first retention cell is transmitted by a second retention cell to an input of the first flip-flop.

18. A method according to claim 17, comprising:
   providing data from a first output terminal of the first flip-flop to a first input terminal of a second flip-flop;
   providing a scan signal from an output terminal of the first retention cell to a second input terminal of the second flip-flop; and
   providing to each of the flip-flops an enabling signal that causes a logic state on the second input terminal of the second flip flop to propagate towards an output terminal of the second flip-flop.

19. A method according to claim 17, wherein passing from the normal operation mode to the low consumption operation mode comprises:
   activating a low consumption command signal which prevents propagation of the data present on the output of the first flip-flop to the output of the first retention and causes the latch circuit to memorize the data previously loaded in the retention cell;
   removing the supply voltage of the flip-flop.

20. A method according to claim 19, wherein passing from the low consumption mode to the normal operation mode comprises:
   restoring the supply voltage of the flip-flop;
   activating an enabling signal which enables the first flip-flop;
   activating a clock signal controlling the first flip-flop;
   deactivating the low consumption command signal; and
   deactivating the enabling signal.

21. A low consumption flip-flop circuit with data retention, comprising:
   a first flip-flop having a first input terminal configured to receive a logic state, a first output terminal, a second output terminal, and a supply terminal configured to receive a first supply voltage;
   a first retention cell having a first input terminal coupled to the second output terminal of the first flip-flop, a second input terminal configured to receive a low consumption command, a first supply terminal configured to receive the first supply voltage, a second supply terminal configured to receive a second supply voltage that is independent of the first supply voltage, and a first output terminal, wherein the first retention cell is configured to provide to the first output terminal of the first retention cell a logic state from the first input terminal of the first retention cell during a normal operation mode, the first retention cell comprises:
      a latch circuit configured to be powered by the second supply voltage and suitable to, during a low consumption mode in which the first flip-flop is not powered by the first supply voltage, memorize a logic state corresponding to a last logic state present on the second output terminal of the first flip-flop;
      a third input terminal;
      a first transmission port having an input terminal coupled to the first input terminal of the first retention cell and an output terminal coupled to the latch circuit of the first retention cell;
      a second transmission port having an input terminal coupled to the latch circuit of the first retention cell and an output terminal coupled to the first output terminal of the first retention cell; and
      a third transmission port having an input terminal coupled to the third input terminal of the first retention cell and an output terminal coupled to the first output terminal of the first retention cell,
      said first, second and third transmission ports being configured to be powered by the first supply voltage during a normal operation mode and not powered by the first supply voltage during a low consumption mode, and configured to switch from the normal operation mode to the low consumption mode in response to the low consumption command, wherein each port is configured to transmit a logic state from the input terminal of the port to the output terminal of the port during the normal operation mode, and is configured to have a high impedance and prevent transmission of the logic state from the input terminal of the port to the output terminal of the port during the low consumption mode.

22. A circuit according to claim 21, wherein said transmission ports are configured to perform a NOT operation, in the normal operation mode.

23. A circuit according to claim 21, wherein the first transmission port comprises
   first and second P-MOS transistors coupled between the output terminal of the first transmission port and the first supply terminal, the first P-MOS transistor being configured to be controlled by the low consumption command signal; and
   first and second N-MOS transistors coupled between the output terminal of the first transmission port and a zero logic terminal, the second N-MOS transistor being configured to be controlled by the negated low consumption command signal.

24. A low consumption flip-flop circuit with data retention, comprising:
   a flip-flop having a first input terminal configured to receive a logic state, a first output terminal, a second output terminal, and a supply terminal configured to receive a first supply voltage;

a retention cell having a first input terminal coupled to the second output terminal of the flip-flop, a second input terminal configured to receive a low consumption command, a first supply terminal configured to receive the first supply voltage, a second supply terminal configured to receive a second supply voltage that is independent of the first supply voltage, and a first output terminal, wherein the retention cell is configured to provide to the first output terminal of the retention cell a logic state from the first input terminal of the retention cell during a normal operation mode, the retention cell comprises:

a latch circuit configured to be powered by the second supply voltage and suitable to, during a low consumption mode in which the flip-flop is not powered by the first supply voltage, memorize a logic state corresponding to a last logic state present on the second output terminal of the flip-flop, the latch circuit comprises:

a first inverter configured to be powered by the second supply voltage and having an input terminal and an output terminal; and a first transmission port having an input terminal, a control input terminal, and an output terminal, the input terminal being coupled to the output terminal of the first inverter, the control input terminal being coupled to the second input terminal of the retention circuit, and the output terminal being coupled to the input terminal of the first inverter, the first transmission port being configured to be powered by the second supply voltage and controlled by the low consumption command signal so as to switch from a state of conducting, wherein a logic state present on the input terminal of the first transmission port is transmitted negated to the output terminal of the first transmission port, and a state of high impedance, wherein the logic state present on the input terminal of the first transmission port is prevented from being transmitted to the output terminal of the first transmission port; and the retention cell includes a second inverter having an input terminal coupled to the output terminal of the first transmission port and an output terminal coupled to a second output terminal of the retention cell.

25. A circuit according to claim 24, wherein the first transmission port of comprises:

first and second P-MOS transistors coupled between the output terminal of the first transmission port and the second supply terminal, the first P-MOS transistor being configured to be controlled by a negated low consumption command signal; and first and second N-MOS transistors coupled between the output terminal of the first transmission port and a zero logic terminal, the second N-MOS transistor being configured to be controlled by the low consumption command signal.

26. A circuit according to claim 25, wherein the retention cell includes a second transmission port coupled between the first supply terminal and the zero logic terminal, the second transmission port includes:

an input terminal coupled to the first input of the retention cell;

an output terminal coupled to the input terminals of the first and second inverters;

third and fourth P-MOS transistors coupled between the output terminal of the second transmission port and the first supply terminal, the third P-MOS transistor being configured to be controlled by the low consumption command signal;

third and fourth N-MOS transistors coupled between the output terminal of the second transmission port and the zero logic terminal, the fourth N-MOS transistor being configured to be controlled by the negated low consumption command signal, the transistors of the second transmission port having a standard voltage threshold and the transistors of the first transmission port having a high voltage threshold.

27. A low consumption flip-flop circuit with data retention, comprising:

a first flip-flop having a first input terminal configured to receive a logic state, a first output terminal, a second output terminal, and a supply terminal configured to receive a first supply voltage;

a first retention cell having a first input terminal coupled to the second output terminal of the first flip-flop, a second input terminal configured to receive a low consumption command, a first supply terminal configured to receive the first supply voltage, a second supply terminal configured to receive a second supply voltage that is independent of the first supply voltage, and a first output terminal, wherein the first retention cell is configured to provide to the output terminal of the first retention cell a logic state from the first input terminal of the first retention cell during a normal operation mode, the first retention cell comprises:

a latch having a supply terminal coupled to the second supply terminal, a first input terminal coupled to the second output terminal of the first flip-flop, a second input terminal configured to receive the low consumption command signal as an enabling signal, and an output terminal, said latch circuit being configured to be powered by the second supply voltage and suitable to, during a low consumption mode in which the first flip flop is not powered by the first supply voltage, memorize a logic state corresponding to a last logic state present on the second output terminal of the first flip-flop; and a multiplexer having a supply terminal coupled to the first supply terminal, a first input terminal, a second input terminal, a selection terminal and an output terminal, the first input terminal being coupled to the output terminal of the latch, the second input terminal being coupled to a third input terminal of the first retention cell, the selection terminal being configured to receive the low consumption command signal as a selection signal, and the output terminal being coupled to the first output terminal of the first retention cell, said multiplexer being configured to, in the normal operation mode, transmit data or a logic state on the first input terminal of the multiplexer to the output terminal of the multiplexer, and, on a return of the circuit to the normal operation mode, transmit a logic state present on the second input terminal of the multiplexer to the output terminal of the multiplexer.

28. A circuit according to claim 27 wherein the first flip-flop and the first retention cell are integrated in a single semiconductor chip.

29. A method, comprising:

providing to a first retention cell a logic state on a first output of a first flip-flop during a normal operation mode of the first flip-flop without influencing operation of the first flip-flop;

powering a latch circuit of the first retention cell using a different supply voltage independent of a supply voltage of the first flip-flop;

memorizing in the latch circuit, during a low consumption operation mode, a last logic state present on the first output of the first flip-flop;

providing data from a second output of the first flip-flop to a first input of a second flip-flop;

providing a scan signal from an output of the first retention cell to a second input of the second flip-flop; and providing to each of the flip-flops an enabling signal that causes a logic state on the second input of the second flip flop to propagate towards an output of the second flip-flop.

30. A method according to claim 29, wherein passing from the normal operation mode to the low consumption mode comprises:

activating a low consumption command signal which prevents propagation of the data present on the first output of the first flip-flop to the output of the first retention cell and causes the latch circuit to memorize the data previously loaded in the first retention cell;

removing the supply voltage of the first and second flip-flops.

31. A method according to claim 30, wherein passing from the low consumption mode to the normal operation mode comprises:

restoring the supply voltage of the first and second flip-flops;

activating an enabling signal which enables the first and second flip-flops;

activating a clock signal controlling the first and second flip-flops;

deactivating the low consumption command signal; and deactivating the enabling signal.

* * * * *